(12) United States Patent
Lerner

(10) Patent No.: US 10,186,502 B1
(45) Date of Patent: Jan. 22, 2019

(54) INTEGRATED CIRCUIT HAVING A COMPONENT PROVIDED BY TRANSFER PRINT AND METHOD FOR MAKING THE INTEGRATED CIRCUIT

(71) Applicant: X-FAB SEMICONDUCTOR FOUNDRIES AG, Erfurt (DE)

(72) Inventor: Ralf Lerner, Erfurt (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 15/607,915

(22) Filed: May 30, 2017

(30) Foreign Application Priority Data

May 30, 2016 (DE) .......... 10 2016 109 950

(51) Int. Cl.
| | |
|---|---|
| H01L 23/544 | (2006.01) |
| H01L 25/18 | (2006.01) |
| H01L 23/538 | (2006.01) |
| H01L 23/522 | (2006.01) |
| H01L 23/528 | (2006.01) |
| H01L 23/00 | (2006.01) |
| H01L 25/00 | (2006.01) |
| H01L 23/367 | (2006.01) |
| H01L 21/683 | (2006.01) |

(52) U.S. Cl.
CPC .......... *H01L 25/18* (2013.01); *H01L 21/6835* (2013.01); *H01L 23/367* (2013.01); *H01L 23/528* (2013.01); *H01L 23/5226* (2013.01); *H01L 23/5389* (2013.01); *H01L 24/19* (2013.01); *H01L 24/24* (2013.01); *H01L 25/50* (2013.01); *H01L 2221/68354* (2013.01); *H01L 2221/68368* (2013.01); *H01L 2221/68377* (2013.01); *H01L 2224/24147* (2013.01); *H01L 2224/82005* (2013.01)

(58) Field of Classification Search
USPC ........................ 257/620, 678–733, 787–796, 257/E23.001–E23.194, E21.499–E21.519; 438/15, 26, 51, 55, 64, 106, 124, 127
See application file for complete search history.

(56) References Cited

U.S. PATENT DOCUMENTS

| | | | |
|---|---|---|---|
| 6,332,561 B1 | 12/2001 | Garcia et al. |
| 6,333,561 B1 | 12/2001 | Chen |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 8,664,699 B2 | 3/2014 | Nuzzo et al. |

(Continued)

FOREIGN PATENT DOCUMENTS

| | | |
|---|---|---|
| DE | 112011101135 | 3/2013 |
| WO | WO 03/030254 | 4/2003 |
| WO | WO 2005/076679 | 8/2005 |

*Primary Examiner* — Tram H Nguyen
(74) *Attorney, Agent, or Firm* — Hunton Andrews Kurth LLP

(57) ABSTRACT

A component to be transferred to a receiving substrate is to be coupled both electrically and thermally. This is achieved by an integrated circuit comprising a substrate and a plurality of first components formed in or on the substrate. A plurality of metallization layers are provided. A second component applied by transfer printing is provided which is positioned, at least in part, on a level with and laterally adjacent to at least one of the plurality of metallization layers.

26 Claims, 8 Drawing Sheets

(56) References Cited

U.S. PATENT DOCUMENTS

| | | | |
|---|---|---|---|
| 2007/0025092 A1* | 2/2007 | Lee | H01L 23/49822 361/761 |
| 2007/0273023 A1* | 11/2007 | Zhao | H01L 23/13 257/706 |
| 2009/0294803 A1 | 12/2009 | Nuzzo et al. | |
| 2013/0069275 A1 | 3/2013 | Menard et al. | |
| 2014/0027709 A1 | 1/2014 | Higginson | |
| 2017/0207197 A1* | 7/2017 | Yu | H01L 23/481 |
| 2017/0221830 A1* | 8/2017 | Scanlan | H01L 23/5389 |

* cited by examiner

INTEGRATED CIRCUIT HAVING A COMPONENT PROVIDED BY TRANSFER PRINT AND METHOD FOR MAKING THE INTEGRATED CIRCUIT

FIELD OF DISCLOSURE

These inventions relate generally to the production of integrated circuits, wherein one or more components, which are produced on a different substrate, are transferred, for example, for providing the receiving integrated circuit with different component properties which would not, or only with great efforts, be achievable by process technologies applied for the production thereof.

BACKGROUND OF DISCLOSURE

In today's process technologies for the production of integrated circuits, many components in and on a substrate are produced by applying specific process technologies. In recent developments, for enhancing component properties and/or process technologies, components are produced on a substrate by applying different process technologies and/or process materials, and are then transferred to the integrated circuit, this being performed as a so-called printing process or transfer print. For example, a component produced, for instance, on the basis of GaN, in the example in the form of a high-voltage transistor, is transferred to a CMOS environment in order to provide the underlying CMOS circuit with properties which cannot, or only with very great efforts, be obtained otherwise.

By transfer printing, semiconductor components can be released from a first semiconductor wafer and transferred to a second semiconductor wafer by use of a stamp and printed thereon.

US 2009/0294803 A1, DE 11 2011 101 135 T5 and U.S. Pat. No. 8,664,699 B2 describe methods of transfer printing, in which semiconductor components can be transferred from a first semiconductor wafer to a new substrate by use of a stamp made of elastomeric material. This second substrate may, for example, also be a second semiconductor wafer. The components to be transferred are initially masked and etched free at the sides. In this etching step, etching is performed around the component except for small (narrow) so-called breakable connection elements (tether).

In a next etching step, etching is performed beneath the component, wherein the component is mechanically retained by the said connection elements.

A part of the components is brought into conformal contact with the surface of the stamp and released from the first semiconductor wafer by adhesion to the stamp, which means that the connection elements are fractured in this procedure. Depending on the fracture behavior of the connection elements, residues of the fractured connection elements are still visible at the sides of the released component, also in the following state.

Then, the components adhering to the stamp are moved by the stamp and brought into conformal contact with the new substrate. There, they are fixed. Residues of the fractured connection elements are (still) visible at the sides of the fixed component.

Using this method, it is possible to transfer, per stamping procedure, a plurality of GaN transistors from a first semiconductor wafer to a second semiconductor wafer, wherein the semiconductor wafers may differ in type of material, crystal orientation, wafer diameter and wafer thickness. After transfer printing, for example, insulation layers as well as conductive layers can be deposited all over the wafer and then structured in further semiconductor-process processing steps. The processing on the basis of a complete semiconductor wafer enables a cost-effective manufacture due to the parallel processing of a plurality of circuits in the same processing step. For example, transferred GaN transistors with high mobility can be covered with an insulation layer, which layer is then structured with vias and wired to a metallization layer or metal layer.

U.S. Pat. No. 7,932,123 B2 describes methods, according to which the functional structures are made "printable" by a plurality of so-called "release layers".

U.S. Pat. No. 7,943,491 B2 and US 2013/0069275 A1 describe a controlled method, in which the adhesion forces occurring between a component to be transferred and the transfer stamp are changed by means of the separation rate in order to temporarily attach the components to be transferred to the stamp, and to then finally fix them to the receiving substrate. In the case of a fast separation, high adhesion forces are created so that the components are temporarily attached to the stamp and released from the donor substrate, wherein the components can be released from the stamp by use of low separation rates and thus low adhesion forces.

U.S. Pat. No. 7,799,699 B2 describes etching free AlGaN/GaN heterostructure components on (111) silicon. By suitable masking and vertical plasma etching (inductively coupled plasma), exposed, i.e. unmasked trenches are etched next to the component. In the horizontal direction, the components are etched free by etching the silicon substrate beneath the component with tetramethylammonium hydroxide (THAH). Mechanical fixing is performed in the horizontal direction by suitable interruptions of the trenches, i.e. by material bridges which are not etched away.

WO 2005/076679 describes a target substrate for a method for transfer printing which is also made of semiconductor materials, wherein nanotubes are applied to the substrate. Electrodes on the substrate serve the purpose of electrically contacting and mechanical attachment and orientation, respectively.

U.S. Pat. No. 6,332,561 B1 describes a substrate, in which soldering points are required for attaching a semiconductor component and an integrated circuit, respectively, on the substrate.

The above-described prior art provides promising approaches for transferring components of a first type to a substrate, on which components of a second type have been produced or are produced. However, for ensuring the required functionality of the transferred components on the receiving substrate, a suitable electrical, mechanical and thermal connection to the receiving substrate is required.

SUMMARY OF INVENTION(S)

There is a need for ensuring that a component to be transferred to a receiving substrate is coupled in both an electrically and thermally efficient manner.

In one aspect (first invention) an integrated circuit is provided which comprises a substrate, a plurality of first components formed in and/or on the substrate, and a plurality of metallization layers (claim 1). The integrated circuit further comprises a second component applied by transfer printing which is positioned, at least in part, on a level with and laterally adjacent to at least one of the plurality of metallization layers.

The integrated circuit according to the invention provides an efficient coupling, at least in a thermal respect, since the second component is arranged, at least in part, in the metallization level of the receiving substrate.

Thus, at least one of the plurality of metallization layers is arranged laterally level with a part of the second component. Thus, the second component is "integrated" into the entirety of the metallization layers and hence coupled at least thermally. Owing to the distinct metal areas present in the plurality of metallization levels, a highly efficient distribution of the heat generated in the second component is achieved so that, for example, transistors operating at high currents and/or high switching rates are able to efficiently distribute their thermal losses in a large area of the receiving substrate. Furthermore, the "integration" of the second component into the plurality of metallization layers of the receiving substrate provides an excellent starting basis for the further processing, in particular, for the electrical connection of the second component, since especially the further wiring layers for the second component and the metallization layers electrically connecting the components on the receiving substrate can be produced.

In an advantageous embodiment, a metal-containing area is provided beneath the second component and between the second component and the substrate. Owing to its arrangement beneath the second component, the metal-containing area is thus in extensive thermal contact with the second component, and due to its high metal content it is able to effectively receive heat from the second component and distribute it in a large area so that an effective heat-distribution structure is formed.

In a further advantageous embodiment, the metal-containing area is a part of one or more of the plurality of metallization layers. In other words, the metal-containing area arranged beneath the second component is a component part of at least one of the plurality of metallization layers and can thus be produced together with the residual part of this metal layer in the same working process, wherein precisely the structural conditions in the production of the metallization layer are considered in order to thus take into account the requirements as a heat-distribution structure for the second component. When designing the metallization layer in question, this metallization layer is provided with appropriate dimensions such that, on the one hand, it maintains the electrical insulation from adjacent metal areas, and, on the other hand, provides a desired efficient heat distribution and thermal coupling for the second component. In particular, due to this measure, there is no need for additional process steps for providing the metal-containing area for thermal coupling to the second component.

In a further embodiment, the metal-containing area comprises a plurality of contacts and/or vias. In this regard, contacts are to be understood as metal areas connecting a metallization layer (a metal area formed in the metallization layer) to an area of a component produced on the basis of the substrate material, for example, a transistor, capacitor, resistor or the like. On the other hand, herein a via is understood to be a metal area connecting two metallization layers adjacent in the "vertical" direction to each other. Thus, according to this embodiment, the metal-containing area comprises corresponding contacts and/or vias which, in turn, can be produced together with other contacts and/or vias which are required in the residual metallization layer for electrical connection, or for wiring in general so that a large amount of metal can be arranged beneath the second component, but without the need for additional process steps. Due to the fact that contacts and/or vias are formed beneath the second component, not only an efficient thermal coupling and distribution is achieved, but also a high degree of mechanical strength, since an intensive "toothing" of the metal areas with the surrounding dielectric is accomplished due to the contacts and/or vias.

In an advantageous embodiment, the metal-containing area is formed as an extensive contact. In this embodiment, an extensive metal area, e.g. in the form of a metal plate, is produced within the scope of production of other contacts, i.e. of metal areas forming a connection to semiconductor-based areas of components without the need for additional process steps, thereby forming an efficient heat-distribution layer. In this embodiment, one of the metallization layers of the substrate located close to the substrate is structured as a large plate. By use of the metallic plate, heat can be effectively laterally distributed. In connection with further areas of metallization layers provided in the metal-containing area in further embodiments, an efficient "vertical" distribution of the heat of the second component can further be achieved, as already mentioned.

In a further advantageous embodiment, an electrically conductive substrate area is provided beneath the second component. In this variant, embedding (also referred to as "integration") of the second component into the plurality of metallization layers is performed such that the second component is thermally coupled to the conductive substrate area so that this substrate area is able to efficiently provide for a lateral and vertical distribution of heat.

In a further embodiment of the above-described embodiment, a buried dielectric layer is provided between the conductive substrate area and the second component. In this variant, a semiconductor-on-insulator configuration (as an SOI configuration) can be effectively used for achieving a good thermal coupling of the second component to the receiving substrate by using precisely the conductive substrate area beneath the buried dielectric layer as a heat-distribution structure.

In a further embodiment, the second component rests on a lowered area of a dielectric layer. The second component is applied to a previously produced dielectric layer by transfer printing so that an electrical separation of the second component from certain substrate areas and especially from areas of the plurality of metallization layers is ensured. Preferably, the thickness of the dielectric layer is selected such that, on the one hand, a further processing, e.g. for forming further metallization layers, can be performed unimpeded and, on the other hand, a heat resistance to the metal-containing area or the conductive substrate area is low so that an efficient thermal coupling of the second component to areas beneath the second component is nevertheless ensured.

In a further embodiment, a non-lowered area of the dielectric layer functions as an insulation layer, or at least as a part thereof, for one of the plurality of metallization layers. Thus, electrical insulation of the second component can be achieved without additional process steps, since the insulation layer for the metallization layer in questions is to be provided in any case.

In further embodiments, a metallization layer is arranged above the second component. The metallization layer above the second component is used, for example, for enabling electrical contacting of the second component and, if required, a connection of the second component to some of the first components in further areas of the metallization layer. Also, two or more metallization layers can be formed above the second component for achieving the required electrical connection of the second component and the wiring of the first components, and a possibly required wiring of some of the first components to the second component.

As further embodiments, "integration" of the second component into the plurality of metallization layers is performed such that a projection of the second component with respect to laterally adjacent areas is small so that the further processing can be performed on the basis of a relatively planar surface.

In a further embodiment, the metallization layer arranged above the second component comprises one or more contacts which are connected to the second component. Thus, as already explained, the possibility is created to electrically connect the second component in a suitable manner.

According to a further aspect (second invention) of the general inventive idea, a method for producing an integrated circuit is disclosed (claim 15).

The method comprises forming a pit in at least one metallization layer in such a manner that the pit extends up to a metal-containing area, or a buried dielectric layer located above a conductive substrate area. Further, a dielectric layer is formed in the pit and above the at least one metallization layer. Furthermore, a component is arranged on the dielectric layer in the pit by transfer printing.

Thus, it is possible to suitably arrange a component produced on another substrate in the area of the metallization layers by transfer printing.

In a related embodiment, in the option in which the metal-containing area is provided and the pit is formed up to this area, the metal-containing area is formed in the production of a lower metallization layer produced prior to the at least one metallization layer, or in the production of contacts and/or vias beneath the lower metallization layer. The procedure of forming the metal-containing area is performed during the production of contacts and/or vias, or when forming the metallization layer so that, as already mentioned, no additional process steps are required, since the lower metallization layer is required for wiring other components in and on the substrate in any case. It is to be considered that also two or more lower metallization layers can be provided, wherein the pit extends up to the topmost of these two or more lower metallization layers.

In a further embodiment, a depth of the pit is adjusted to a height dimension of the component such that a projection of the component is less than 20 µm, preferably less than 5 µm, after arrangement thereof in the pit. Thus, the further processing can be performed on the basis of a relatively planar surface so that well-established process steps can be applied without consideration of an excessive surface topography.

In a further embodiment, adjustment of the depth of the pit to the height dimension of the component is performed via the number of metallization layers produced prior to forming the pit. Usually, a plurality of metallization layers are required for wiring complex integrated circuits. For example, when the component to be transferred has a large height dimension, a major part of the metallization layers can thus already be produced prior to forming the pit such that it extends to a buried dielectric layer or to the metal-containing area which is now a metal-containing area which has already been formed at an early stage, for example, in the production of the first metallization layer. When a small height dimension is provided, the metal-containing area can be produced in a metallization layer located "further above" so that the depth of the pit substantially corresponds to the thickness of the further metallization layers formed above it. Further, by selecting the "target metallization layer" comprising the metal-containing area, the "vertical" position of the component to be transferred can be effectively determined.

In further embodiments, at least one further metallization layer is formed above the component and the component is connected to the at least one further metallization layer. As already explained above, the transferred component can thus be reliably electrically connected by using well-established process steps without the need for additional process steps, since the wiring of other components produced on the basis of the starting substrate can also be performed by means of the at least one further metallization layer.

In further embodiments, the metal-containing area, if provided, or the buried dielectric layer, if provided, functions as an etching stop layer when forming the pit. Thus, well-established production processes can be used for etching the pit, since dielectric materials, for example in the metallization level, are to be etched also in conventional production methods for integrated circuits, for example on the basis of CMOS process technologies, wherein the etching reliably stops in metal areas. Similarly, etching is often to be performed up to the buried dielectric layer of a semiconductor-on-insulator architecture, wherein the buried dielectric layer efficiently functions as an etching stop material. Such process technologies can thus be efficiently used for forming the pit.

Further embodiments are apparent from the dependent claims.

INTRODUCTION TO THE DRAWINGS

The inventions are illustrated by one or more examples, however, not in a way that transfers or incorporates limitations from the Figures into the patent claims. Same reference numerals in the Figures indicate similar elements.

Figure 7:
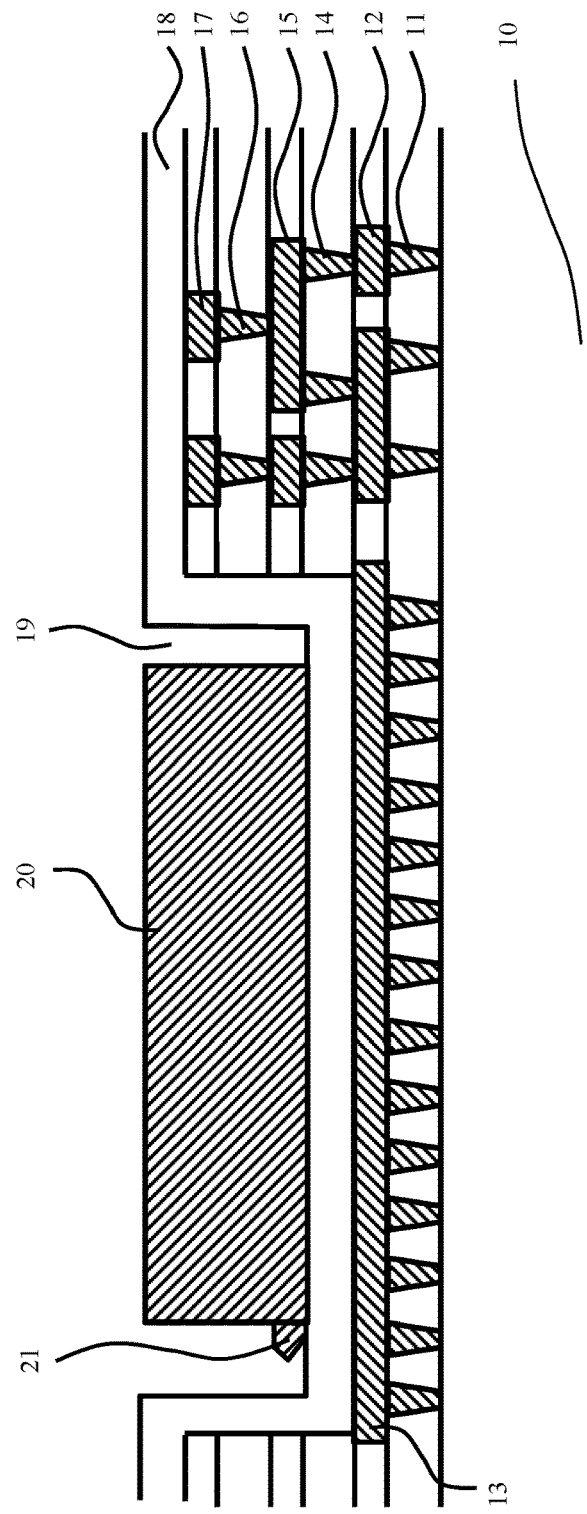

FIG. 7 shows the second semiconductor wafer 10 including the CMOS metallization layers, the printed component located in the pit 19 and the heat distributor with a plurality of contacts beneath it. Residues 21 of the fractured connection elements are visible on the left of the printed component 20 which is placed and fixed in the pit 19.

DETAILED DESCRIPTION (DISCLOSURE)

Further illustrative embodiments will now be described in detail with reference to the drawings. Generally, it is to be noted that a desired high electrical insulation for a component to be applied by transfer is achieved according to the invention, whereas only a low thermal insulation between the component applied by transfer and the residual components of an integrated circuit including the corresponding substrate is accomplished. In other words, a sufficient electrical insulation and an efficient thermal coupling of the component applied by transfer are achieved at the same time.

In advantageous variants, a relatively planar surface is created even after arrangement of the component to be transferred, as illustrated below, since the component to be transferred is embedded or "integrated" adjacent to one or more metallization layers. Thus, no or only a very low step is formed by the transferred component so that the further processing, for example, in the form of flip-chip technologies or the like, can be performed without substantially interfering therewith.

For this purpose, a metal-containing area, for example in the form of a large plate, is formed in a metallization layer located close to the substrate in some embodiments. Owing to the metal-containing area or the metallic plate, heat can be effectively laterally distributed, wherein also a vertical distribution of the heat of the transferred component is accomplished by a plurality of contacts or vias in one variant. In this regard it is to be noted that indications of direction, such as "above", "beneath", "vertical", "lateral or horizontal" are not to be understood as absolute terms. Rather, corresponding indications are always to be understood as relating to the underlying substrate, wherein a direction in which a distance to the substrate surface, or at least a defined part thereof, changes at the maximum when approaching or departing from the substrate surface, is referred to as a "vertical" direction, and a direction in which the distance to the substrate surface does not change when a position is shifted, is referred to as a "lateral or horizontal" direction. The same applies to similar terms, such as "above", "lateral", "beneath" and the like.

The dielectric materials for the production of vias and contacts can be removed in subsequent steps, or also in a separate step until a corresponding pit having the desired lateral dimensions is formed, which pit extends to the metal-containing area. The metal-containing area, for example in the form of a metal plate, contacts and/or vias, functioning as a heat-distribution structure simultaneously has the effect of a stop layer in this process. In embodiments, a dielectric material is then extensively conformally deposited and left in the pit as a passivation layer, or as a dielectric layer, or as a part thereof for a further metallization layer. The component to be integrated or transferred is printed onto the dielectric material in the pit by transfer. The depth of the pit roughly corresponds to the thickness of the component, i.e. its height dimension, in order to thus avoid larger steps on the surface. The passivation layer serves the purpose of insulation between the transferred component and the residual structures of the receiving semiconductor wafer.

In alternative embodiments, a semiconductor-on-insulator wafer, for example an SOI wafer (silicon on insulator) is used, wherein the buried dielectric layer, such as the buried oxide, functions as an etching stop layer and insulator, and the conductive substrate material beneath the buried dielectric layer serves the purpose of heat distribution. Also in this case, especially the topmost metallization layer can be used for CMOS wiring and for wiring the transferred component.

As already described above, the depth of the pit to be formed in the metallization layers can be set such that it is suitably adjusted to the height dimension of the component to be transferred so that a needless step of e.g. more than 20 μm is avoided. For adjustment, the number and position of the metallization layers, through which the pit is formed, can be selected accordingly.

Figure 1:
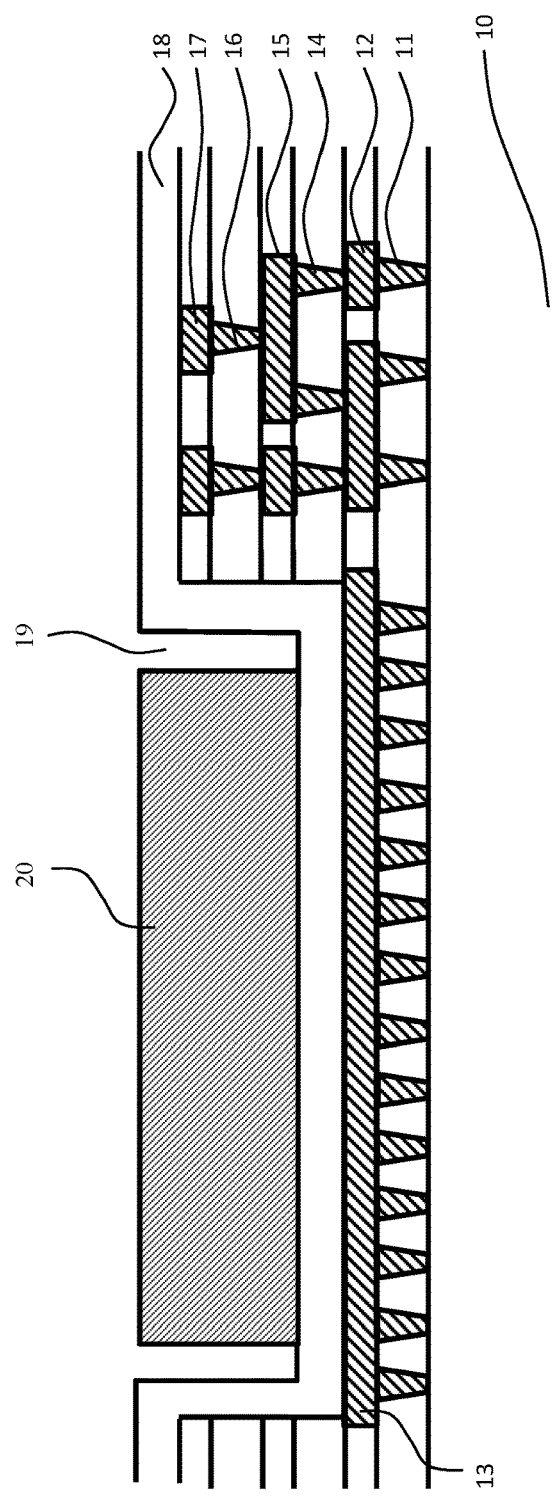
FIG. 1 shows a semiconductor wafer including CMOS metallization layers which serves as an example of a receiving substrate comprising an integrated circuit, wherein a transferred component is provided in a pit 19 and heat distribution is accomplished by a plurality of contacts.

FIG. 1 shows a semiconductor wafer 10 and metal layers (as metallization layers) produced in a production method, which are produced, for example, in a CMOS process. By way of example, three metallization layers are shown . . . .

A first metallization layer 12, which is connected via contacts 11 to not shown components produced, for example, by CMOS processes.

A second metallization layer 15, which is connected via first vias 14 to the first metallization layer 12.

A third metallization layer 17, which is connected via second vias 16 to the second metallization layer 15.

A metal-containing area 13, which functions as a heat-distribution structure and is formed accordingly, is composed of a portion of the first metallization layer 12 and a plurality of contacts 11 in this embodiment.

Furthermore, a pit 19 is formed in at least one metallization layer such that a transferred component 20 is positioned, at least in part, on a level with and laterally adjacent to at least one of the plurality of metallization layers.

In the example, this is the second metallization layer 15 so that the component 20 is embedded or integrated into the one or more metallization layers, here the metallization layers 12 and 15 in combination with their associated contacts 11 and vias 14. Further, a passivation layer, i.e. a dielectric material 18 is formed in the pit 19 and above the metallization layer 15.

The lowered area of the passivation layer 18 (i.e. the portion of the passivation layer 18 forming the bottom of the pit 19) functions as a support of the transferred and printed component 20. In the illustrated embodiment, the component 20 preferably has a same thickness as the depth of the pit 19, wherein the passivation layer 18 is thus also understood as the bottom of the pit 19. The passivation layer 18 functions as a vertical insulation between the component 20 and the metal-containing area 13 and the semiconductor substrate 10.

The production of the not shown first components, for which reference numeral 10 may be substitutionally used, is performed on the basis of optionally selected process technologies, such as on the basis of CMOS technologies, whereupon the production of the first metallization layer 12 including the contacts 11 is performed. In the process, also the metal-containing area 13 including a desired structure is produced so that no additional steps are required in this respect. Similarly, the further metallization layers 15 and 17 including the corresponding vias 14 and 16 are produced. The pit 19 is formed by etching the dielectric materials, also referred to as intermediate layer dielectric, in which the metal areas of the metallization layers and the contacts and/or vias are formed, by use of well-established etching processes, wherein the metal-containing area 13, especially a coherent metal plate of the metallization layer 12 thereof, is used as an etching stop in the shown embodiment. Deposition of the passivation layer 18 is performed on the basis of well-established process recipes, and the component 20 is provided by known transfer processes, as described in the introductory portion.

Figure 2:
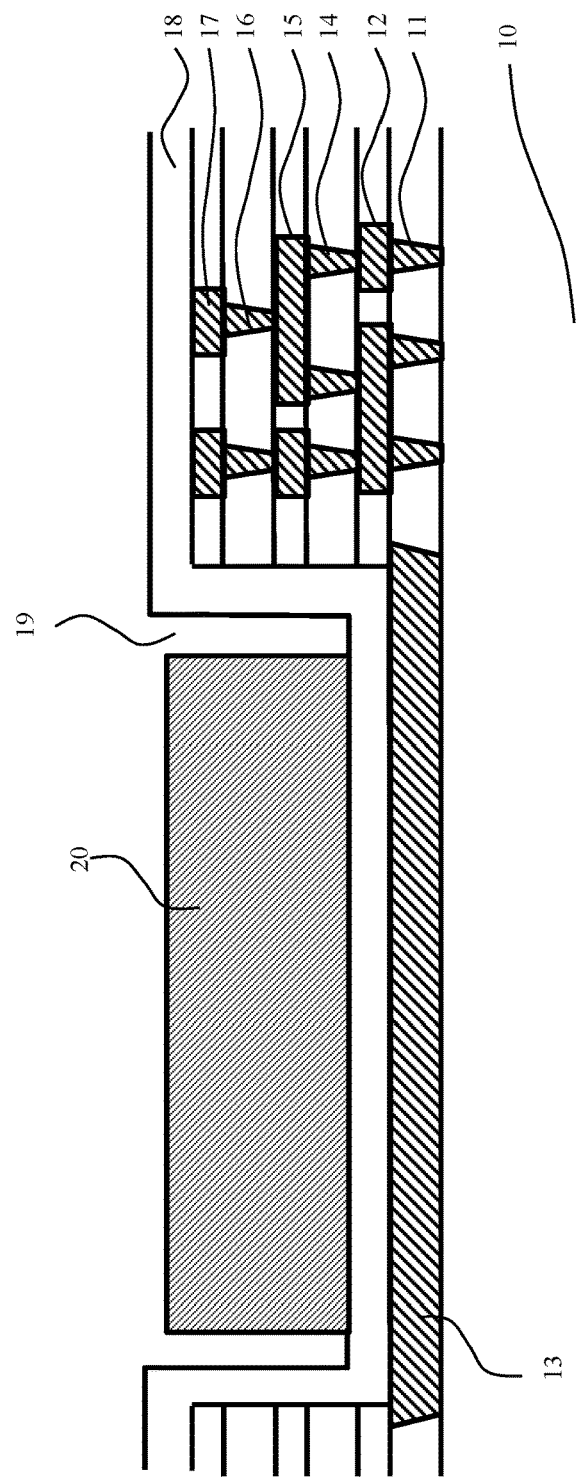
FIG. 2 shows the semiconductor wafer including CMOS metallization layers, the component applied by transfer and located in a pit 19, and a metal-containing area as a heat distributor which is formed by an extensive contact.

FIG. 2 shows a further embodiment similar to the embodiment shown in FIG. 1, in which the substrate or semiconductor wafer 10 and corresponding metallization layers 12, 15 and 17 are provided together with the associated contacts 11 and vias 14 and 16, respectively, which may be made of aluminum and/or copper. Also in this example, three metallization layers are shown, wherein the metal-containing area 13 is composed of a coherent metal plate or larger coherent metal areas in this case. As is apparent from the drawing, the metal-containing area 13 is formed as a part of the level of the contacts 11 so that the area may be understood as an extensive contact which is formed within the scope of the processes for manufacturing the contacts 11, and which functions as a heat-distribution structure.

Also in this example, the pit 19 is produced by etching the dielectric materials of the individual metallization layers in order to achieve a desired depth for the pit 19, as already explained above. Also in this case, well-established process technologies can be employed, wherein the metal plate 13 functions as an etching stop. The transferred component 20 has a height dimension substantially corresponding to the depth of the pit 19 so that, in this case, no undesired projection is created. It is to be noted that, compared to the depth of the pit 19, a too small height dimension of the component 20 can be compensated to a certain degree by subsequent deposition processes. Further, the depth of the pit can be efficiently adjusted to the height dimension of the component 20 by means of the number of metallization layers through which the pit 19 is formed, as already explained above. Thus, a structure is created in which at least parts of the component 20 are arranged on a level with and laterally adjacent to one or more metallization layers.

Figure 3:
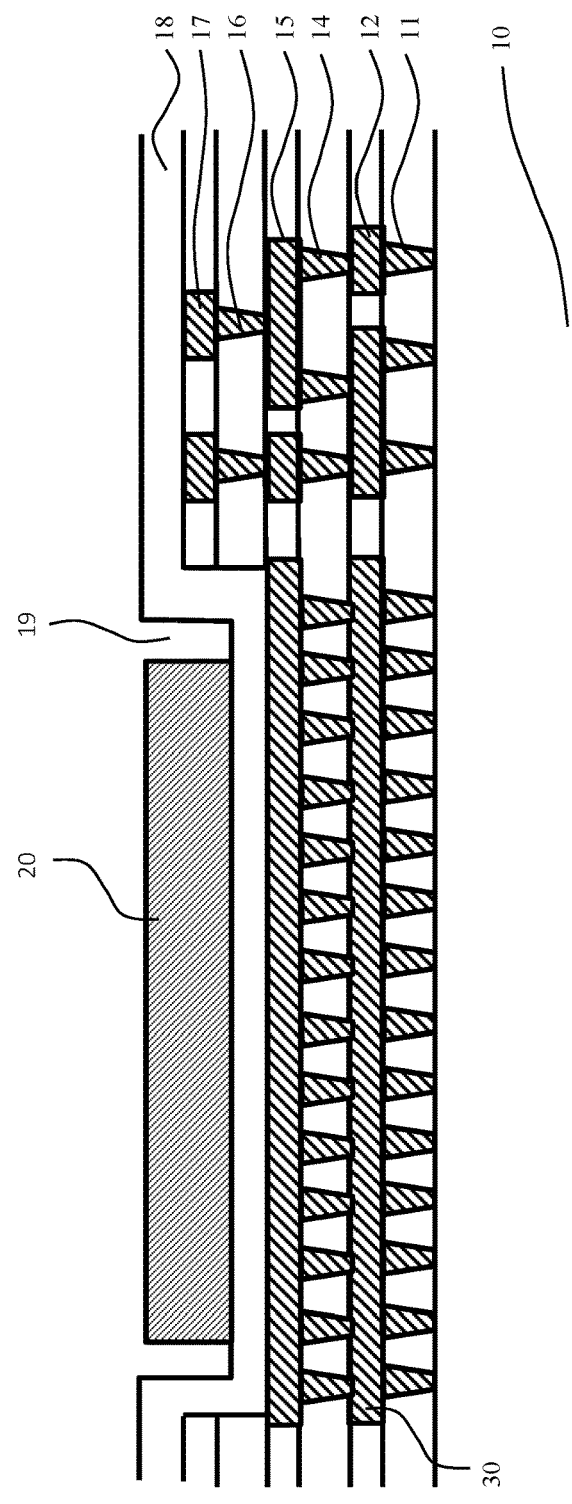
FIG. 3 shows the semiconductor wafer including CMOS metallization layers, the component applied by transfer and located in a pit 19, and a heat distribution which is accomplished by two metallization layers and a plurality of contacts or vias.

FIG. 3 shows another embodiment in which the semiconductor wafer or substrate 10 is provided. Further, for the sake of clarity, again three metallization layers 12, 15 and 17 including the associated contacts 11 and vias 14 and 16, respectively, are provided in which the pit 19 is formed which is positioned laterally adjacent to metal areas of the metallization layer 17 and the vias 16. The component 20 arranged therein again rests on the passivation layer 18 so that at least a part of the component 20 is positioned laterally adjacent to the metallization layer 17 and on a level therewith. In this case, a metal-containing area 30 is formed of metal areas of metallization layers 15 and 12 and a plurality of vias 14 and a plurality of contacts 11. In this case, excellent heat distribution in the lateral direction is achieved by the metal-containing area 30, especially by the coherent metal areas of metallization layers 12 and 15, and excellent distribution in the vertical direction is achieved due to the vias 14 and contacts 11 of the metal-containing area 30. Thus, two metallization layers are provided beneath the component 20 in the shown example. It is to be noted that more than two metallization layers may be provided beneath it, this being dependent on the general complexity of the wiring level and the height dimension and the desired vertical position of the component 20, as explained above.

For a given total number of metallization layers, the number of metallization layers beneath the component and metallization layers still to be formed above it, the depth and/or the vertical position of the pit 19 can thus be set on the basis of the height dimension of the component 20. For the procedure of producing the structure shown in FIG. 3, the same criteria apply as already described above with reference to FIG. 1 and FIG. 2.

Figure 4A:
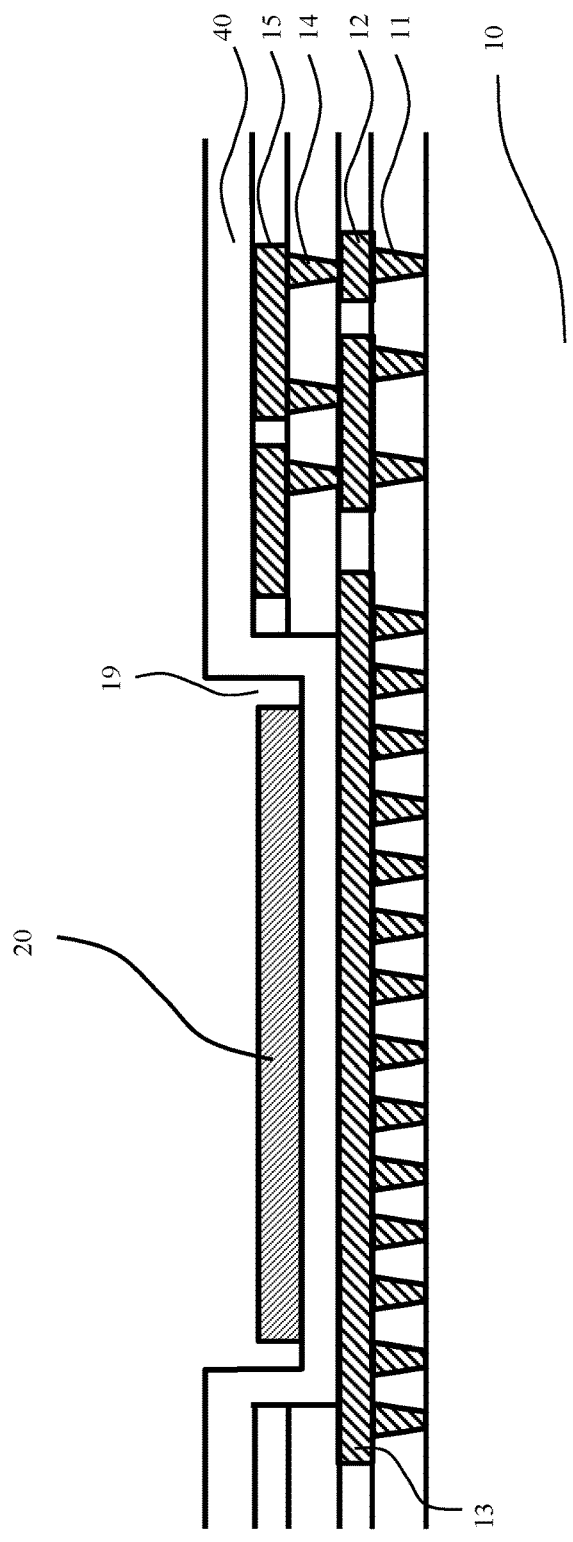
FIG. 4a and FIG. 4b show the semiconductor wafer including CMOS metallization layers, the component applied by transfer and located in a pit, and a heat distribution by means of a plurality of contacts, wherein the top most metallization layer is used for wiring the second component and CMOS components. Different stages of production are shown.

FIG. 4a shows a further embodiment including the semiconductor wafer or substrate 10 and metallization layers provided by a production process, which layers are produced, for example, by a CMOS process. In this example, the two metallization layers 12 and 15 are shown, wherein the pit 19 extends through the metallization layer 15 and the associated layer composed of vias 14 so that at least a part of the component 20 is positioned laterally adjacent to and on a level with the metallization layer 15. A passivation layer in the form of a dielectric material layer 40, which is used for forming further vias for a subsequent metallization layer, is conformally deposited on the metallization layer 15 and in the pit 19, wherein well-established process technologies can be employed. Again, the depth of the pit 19, together with the thickness of the layer 40, is selected such that a projection will be small or zero or negative, for example not more than 20 µm, and preferably not more than 5 µm.

Figure 4B:
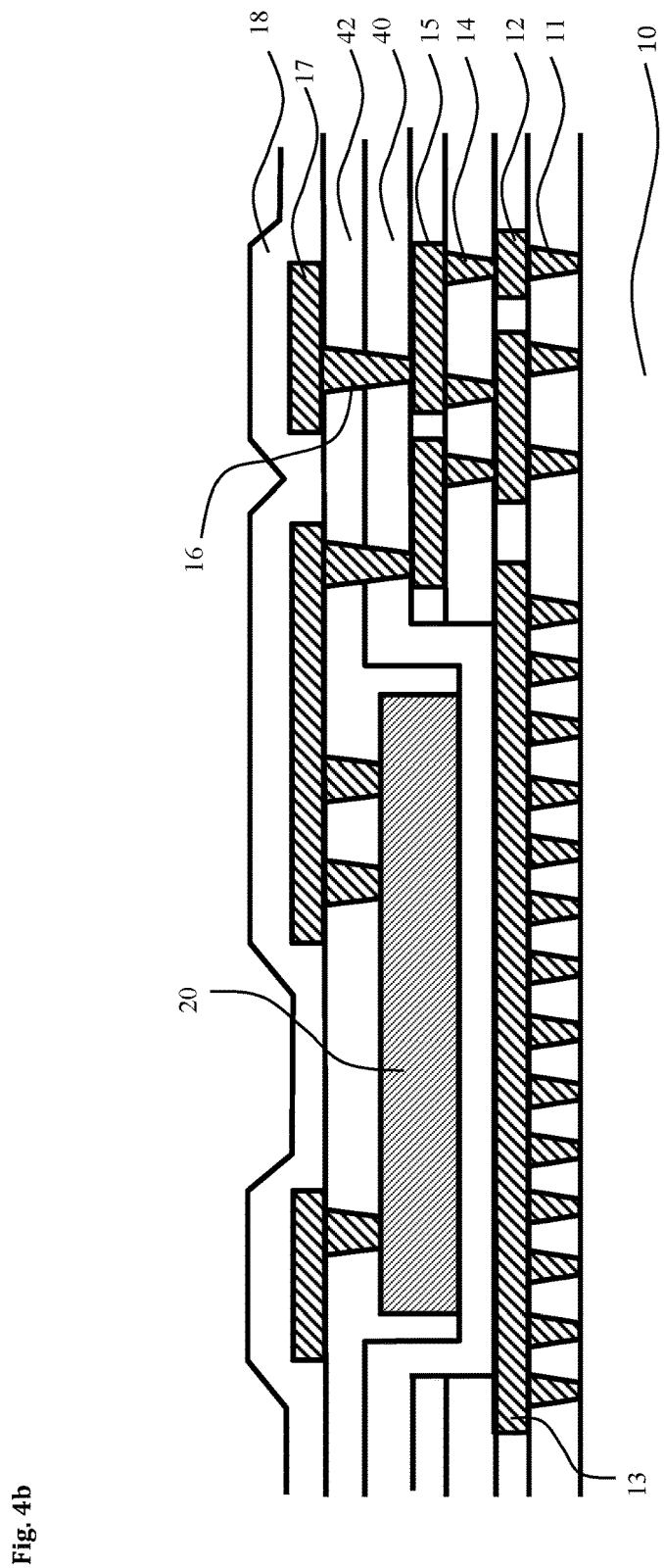

FIG. 4b shows the integrated circuit in a further advanced process stage, in which a further metallization layer 17, together with vias 40, is formed such that a wiring to the existing metallization layer 15 and a contact to the component 20 are made. For this purpose, in addition to the previously applied dielectric metal layer 40, which is to be considered as a lower layer for contact levels, a further dielectric material layer 42 is applied which sets a finally required thickness for the dielectric material above the metallization layer 15, and further provides the required electrical insulation and the distance to the component 20. The layer 42 can be applied by well-established methods, wherein an undesired topography which may possibly be created above the component 20 can be levelled by planarization technologies, if required. After production of the vias 16 above the metallization layer 15 and above the component 20 for electrical and thermal contacting thereof, a passivation layer 18 is produced above the metallization layer 17 on the basis of well-established technologies.

It is to be noted that two or more metallization layers can be produced above the component 20 in further embodiments, this being dependent on the desired vertical position of the component 20, the height dimension thereof, and the total required complexity of the entire wiring level.

Figure 5:
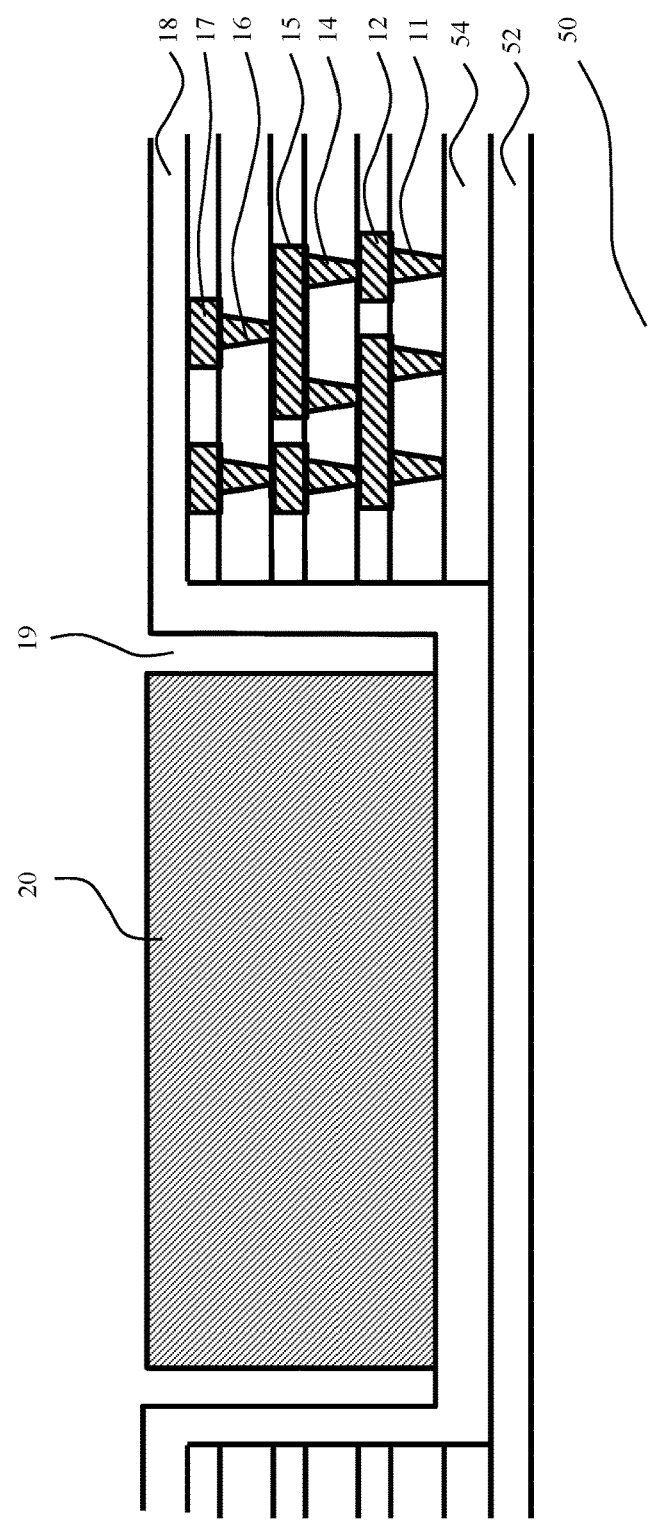
FIG. 5 shows the semiconductor wafer as a semiconductor-on-insulator arrangement (an SOI wafer), wherein CMOS metallization layers and a component applied by transfer are provided. The component is contained in a pit extending up to the buried dielectric layer.

FIG. 5 shows a further embodiment, wherein a semiconductor-on-insulator configuration, for example a silicon-on-insulator configuration (as an SOI) is used. In this case, a carrier substrate 50 representing a conductive substrate, a buried dielectric layer 52, for example a buried oxide, and an active substrate material 54 are provided. Metallization layers, e.g. three metallization layers and associated contacts and vias are formed above the active substrate material 54, as also described with reference to the previous embodiments.

In this embodiment, the pit 19 is formed through the dielectric materials of the individual metallization layers and their associated contact levels and via levels and initially extends up the buried dielectric layer 52 which functions, for example, as an efficient etching stop material in a corresponding etching process.

Further, a passivation layer 18 is formed in the pit 19 so that the transferred and printed component 20 rests on the horizontal portion of the passivation in the pit 19. Electrical insulation of the component 20 with respect to the conductive substrate material 50 is thus accomplished by the passivation layer 18 and the buried dielectric layer 52. On the other hand, a good thermal coupling to the conductive substrate material 50, which provides for vertical and horizontal distribution of heat, is achieved.

Figure 6:
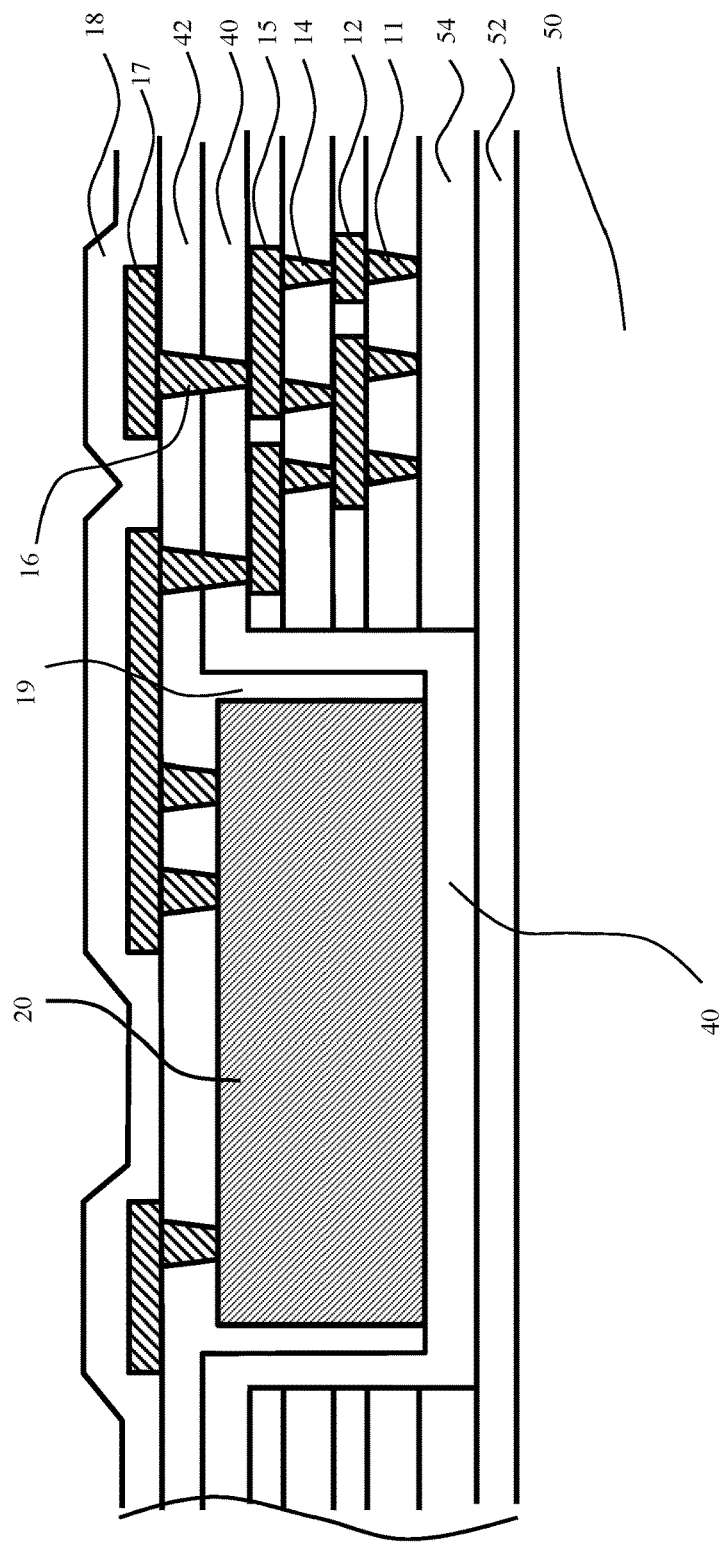
FIG. 6 shows the semiconductor wafer according to FIG. 5, wherein a topmost metallization layer is used for wiring the second component and the not shown CMOS components.

FIG. 6 shows, as a further embodiment or as an advanced process stage of the arrangement shown in FIG. 5, a structure in which the transferred and printed component 20 is again arranged in the pit 19 which, prior to forming a dielectric material which, in this example, is a dielectric material 40, extends up to the buried dielectric layer 52.

The dielectric material 40, together with a further dielectric material layer 42, functions as an insulation layer in which vias 16 for a further metallization layer 17 are formed. As also described with reference to FIG. 4b, further vias 16 are also suitably formed with respect to the component 20 in order to achieve a possibly required electrical connection to the metallization layer 17 also in this case.

A final passivation layer 18 is formed above the metallization layer 17 which is the topmost metallization layer here. With respect to process technologies that can be employed for producing the arrangement shown in FIG. 6, the same criteria apply as already explained before.

FIG. 7 shows the semiconductor wafer 10 from the previous Figure and the metallization layers used in the CMOS process. Also here, three metallization layers are shown in the example. The first one consisting of contacts 11 and the first metal layer 12; the second one consisting of a second metal layer 15 and second vias 14; the third one consisting of a third metal layer 17 and third vias 16.

The heat-distribution structure 13 on the level of the first metal layer 12 includes a plurality of downward contacts 11 and a metallization layer located above it which can be formed, for example, from the first metal layer 12.

A pit 19 is etched into the stack of via oxide layers (intermetal dielectrics, IMD), wherein der metallic distribution structure 13 functions as a stop layer.

A passivation layer 18 is deposited on the CMOS portion as well as in the pit 19. The component 20 is printed on (and fixed to) the passivation layer in the pit 19. Preferably, the component 20 has a thickness corresponding to the depth of the pit 19.

The passivation layer 18 provides a vertical insulation between the component 20 and the heat-distribution layer 13 and/or the semiconductor wafer 10 arranged beneath it. Residues 21 of the connection elements (called: tether) are visible at the sides of the printed component 20. These remaining residues 21 of the tethers (connection elements), only one of which is shown here, are present after releasing the component 20 from the donor wafer and also remain at the printed components on the target wafer, e.g. the semiconductor wafer 10. Origin and development of the printed component(s) 20 are thus still visible and also the production method related thereto is discernible therefrom.

The same applies to all above disclosed components 20 which are produced, lifted, separated, moved and disposed in a new location (printed there) according to the production method.

Generally, it is to be noted that sectional views of a single integrated circuit are shown in FIGS. 1 to 6 and 7, in which circuit first components (not shown) and the transferred component 20 are provided and form a functional unit together with the plurality of metallization layers.

However, typically a plurality of such integrated circuits are present on a common substrate in the shown production stages so that a plurality of such integrated circuits are processed at the same time. Only after a certain production stage is reached, the integrated circuits are separated, wherein well-established process technologies are applied in this respect.

Means are provided for suitably transferring components produced on the basis of another substrate, for example transistors based on GaN, to an integrated circuit, especially in a process stage in which the integrated circuits are not yet separated, wherein excellent thermal coupling and excellent electrical insulation can be achieved. Thus, a well-functioning heat dissipation for transferred and printed components is achieved, wherein a manageable step height for subsequent process steps, e.g. wiring, is provided in specific embodiments. Thus, a generic process is created in which, for example in contrast to a monolithic integration, processes producing critical dimensions of less than 0.6 μm can also be performed in connection with integrated components based on e.g. GaN.

The invention claimed is:

1. An integrated circuit including a substrate, comprising:
   a plurality of first components formed at least one of in and on the substrate with a first metallization layer connected by contacts to said plurality of first components and with a second metallization layer connected by first vias to said first metallization layer;
   a plurality of metallization layers;
   a second component applied by transfer printing, the second component positioned, at least in part, on a level with and laterally adjacent to at least one of the plurality of metallization layers.

2. The integrated circuit according to claim 1, wherein a metal-containing area is provided beneath the second component (20) and between the second component and the substrate.

3. The integrated circuit according to claim 2, wherein the metal-containing area is a part of at least one or more of the plurality of metallization layers.

4. The integrated circuit according to claim 3, wherein the metal-containing area comprises a plurality of one or more contacts and vias.

5. The integrated circuit according to claim 2, wherein the metal-containing area comprises a plurality of one or more contacts and vias.

6. The integrated circuit according to claim 2, wherein the metal-containing area is formed as an extensive contact.

7. The integrated circuit according to claim 1, wherein the second component rests on a lowered portion of a dielectric layer.

8. The integrated circuit according to claim 7, wherein a non-lowered portion of the dielectric layer functions as an insulation layer, or as a part thereof, for one of the plurality of metallization layers.

9. The integrated circuit according to claim 1, wherein a metallization layer is arranged above the second component.

10. The integrated circuit according to claim 9, wherein the metallization layer arranged above the second component comprises at least one contact which is connected to the second component.

11. The integrated circuit according to claim 10, wherein the metallization layer arranged above the second component comprises a plurality of contacts which are connected to the second component.

12. The integrated circuit according to claim 3, wherein the metal-containing area is a part of the plurality of metallization layers.

13. An integrated circuit including a substrate, comprising:
   a plurality of first components formed in or on the substrate;
   a plurality of metallization layers;
   a second component applied by transfer printing which is positioned, at least in part, on a level with and laterally adjacent to at least one of the plurality of metallization layers, the second component applied by transfer printing comprising at least one laterally protruding residue of a connection element which retained the component before release thereof.

14. An integrated circuit including a substrate, comprising:
a plurality of first components formed in or on the substrate;
a plurality of metallization layers;
one or more second components, which are lifted, separated, moved and disposed in a new location, at least in part, on a level with and laterally adjacent to at least one of the plurality of metallization layers by printing via transfer print using one or more connection elements which retained the component before separation thereof, each of the one or more second components comprises at least one laterally protruding residue of a connection element thereof.

15. The integrated circuit according to claim 14, wherein each component comprises a plurality of respective laterally protruding residues of its connection elements.

16. A method for producing an integrated circuit, the method comprising the following steps:
forming a pit in at least one metallization layer, wherein the pit extends up to a metal-containing area, or a buried dielectric layer located above a conductive substrate area;
forming a dielectric layer in the pit and above the at least one metallization layer;
arranging a component in the pit on the dielectric layer by transfer printing comprising a releasing, a transferring, and a printing.

17. The method according to claim 16, comprising forming at least one further metallization layer above the component, and connecting the component to the at least one further metallization layer.

18. The method according to claim 16, wherein the metal-containing area or the buried dielectric layer is used as an etching stop layer.

19. The method according to claim 16, wherein the metal-containing area is formed in the production of a lower metallization layer produced prior to the at least one metallization layer, or in the production of contacts or vias beneath the lower metallization layer.

20. The method according to claim 19, wherein the metal area is formed within the scope of production of a metal layer located further below and thus produced in an earlier stage.

21. The method according to claim 16, wherein a depth of the pit is adjusted to a height dimension of the component such that a projection of the component is less than 20 μm after arrangement thereof in the pit.

22. The method according to claim 21, wherein the projection is less than 5 μm.

23. The method according to claim 21, wherein adjustment of the depth of the pit to the height dimension of the component is performed via a number of metallization layers produced prior to forming the pit.

24. The method according to claim 16, wherein the second component applied by transfer printing comprises at least one laterally protruding residue of a connection element which retained the component before release thereof.

25. The method according to claim 16, wherein one or more components, which are lifted, separated, moved and disposed in a new location by printing via transfer print, each component comprises at least one laterally protruding residue of a connection element.

26. The method according to claim 25, wherein each component, which is arranged in the pit on the dielectric layer by transfer printing, comprising releasing, transferring, and printing, and each component comprises a plurality of respective laterally protruding residues of its connection elements thereof.

* * * * *